US011950382B2

(12) United States Patent
Ho et al.

(10) Patent No.: US 11,950,382 B2
(45) Date of Patent: Apr. 2, 2024

(54) POWER SUPPLY

(71) Applicant: Delta Electronics, Inc., Taoyuan (TW)

(72) Inventors: Chi-Shou Ho, Taoyuan (TW); Ching-Tang Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 557 days.

(21) Appl. No.: 17/167,262

(22) Filed: Feb. 4, 2021

(65) Prior Publication Data

US 2022/0077610 A1 Mar. 10, 2022

(30) Foreign Application Priority Data

Sep. 9, 2020 (CN) .......................... 202021959254.3

(51) Int. Cl.
*H05K 5/02* (2006.01)
(52) U.S. Cl.
CPC .................................. *H05K 5/0217* (2013.01)
(58) Field of Classification Search
CPC ............ H01R 12/7088; H01R 13/5045; H01R 13/6675; H01R 13/7175; H05K 5/0217; H05K 5/0017; H05K 7/1432; F21Y 2115/10
See application file for complete search history.

(56) References Cited

U.S. PATENT DOCUMENTS

| 7,791,864 | B2 * | 9/2010 | Matyas | .................. | H01R 13/68 |
| | | | | | 337/186 |
| 9,894,788 | B2 | 2/2018 | Alexander | | |
| 10,952,344 | B1 * | 3/2021 | Jiang | ..................... | H05K 7/1405 |
| 2011/0223784 | A1 * | 9/2011 | Jiang | ..................... | H05K 7/1492 |
| | | | | | 439/106 |
| 2011/0223785 | A1 * | 9/2011 | Jiang | .................. | H01R 13/6272 |
| | | | | | 439/106 |
| 2012/0049639 | A1 * | 3/2012 | Besore | ................... | G01K 3/005 |
| | | | | | 307/97 |
| 2015/0056853 | A1 * | 2/2015 | Utz | ....................... | H01R 25/164 |
| | | | | | 439/536 |
| 2018/0006416 | A1 * | 1/2018 | Lloyd | .................. | H05K 7/1487 |

(Continued)

FOREIGN PATENT DOCUMENTS

| TW | M454017 U | 5/2013 |
| TW | M454649 U | 6/2013 |
| TW | M533253 U | 12/2016 |

*Primary Examiner* — Sagar Shrestha
(74) *Attorney, Agent, or Firm* — KIRTON McCONKIE; Evan R. Witt (57) ABSTRACT

A power supply is provided. The power supply includes a case, an electrical connector and a LED. The case includes a first side wall including an extension part. The extension part is extended from the first side wall toward a second side wall and has an aperture. Portion of the electrical connector is disposed in an accommodation space through an opening and includes a first base and a contacting ring. The first base is disposed in the accommodation space. The contacting ring is disposed on an exterior of the accommodation space. The LED is disposed in the aperture and includes a second base and a lens disposed on the second base. The second base and the contacting ring are located on different surfaces. The lens and portion of the second base are exposed from the opening. The other portion of the second base is covered by the contacting ring.

9 Claims, 6 Drawing Sheets

(56) References Cited

U.S. PATENT DOCUMENTS

| | | | |
|---|---|---|---|
| 2018/0054030 A1* | 2/2018 | Hewitt | C23C 16/56 |
| 2019/0075679 A1* | 3/2019 | Chou | H05K 7/1457 |
| 2019/0115705 A1* | 4/2019 | Duncan | H01R 27/00 |
| 2019/0166718 A1* | 5/2019 | Minkin | F04D 19/002 |
| 2019/0246529 A1* | 8/2019 | Lu | H05K 9/0094 |
| 2020/0008324 A1* | 1/2020 | Kwon | H02M 7/00 |
| 2020/0049333 A1* | 2/2020 | McCane | F21V 23/003 |
| 2022/0200218 A1* | 6/2022 | Dittus | H01R 27/00 |
| 2022/0225535 A1* | 7/2022 | Yow | H05K 7/20727 |

\* cited by examiner

POWER SUPPLY

CROSS-REFERENCE TO RELATED APPLICATION

This application claims priority to China Patent Application No. 202021959254.3 filed on Sep. 9, 2020. The entire contents of the above-mentioned patent application are incorporated herein by reference for all purposes.

FIELD OF THE INVENTION

The present disclosure relates to a power supply, and more particularly to a power supply for increasing available space within a case of the power supply.

BACKGROUND OF THE INVENTION

With the ongoing trend in the power supply toward high power density and high integration, the volume of the power supply is decreased gradually.

Traditional power supply includes a case, a light emitting diode (LED), a LED substrate and an electrical connector. The LED is used for indicating and illuminating and disposed on the LED substrate. The LED substrate is disposed in an interior of the case of the power supply. Since the volume of the power supply is decreased gradually, the available space within the case of the power supply is compressed by the LED substrate disposed in the power supply. Consequently, portion of electronic devices cannot be disposed in the power supply. Moreover, the LED and the electrical connector of the power supply are disposed on an exterior of the case of the power supply. The entirety of the LED and the electrical connector are exposed from the exterior of the case through an opening of the case. For allowing the LED and the electrical connector to pass through the opening of the case, the area of the opening of the case is greater than or equal to the area of the LED plus the area of the electrical connector. Consequently, the case with larger volume is needed for the power supply, and the development of small-scale power supply is limited.

Therefore, there is a need of providing a power supply so as to address the issues encountered by the prior arts.

SUMMARY OF THE INVENTION

An object of the present disclosure provides a power supply. The power supply has advantage of saving available space within the case of the power supply.

In accordance with an aspect of the present disclosure, a power supply is provided. The power supply includes a case, an electrical connector and a LED. The case includes a first side wall, a second side wall, a third side wall, a fourth side wall and a rear wall. The first side wall and the second side wall are opposite to each other. The third side wall and the fourth side wall are opposite to each other and located between the first side wall and the second side wall. The first side wall, the second side wall, the third side wall, the fourth side wall and the rear wall collaboratively define an accommodation space having an opening. The first side wall includes an extension part. The extension part is extended from the first side wall toward the second side wall and is adjacent to the opening. The extension part has an aperture. Portion of the electrical connector is disposed in the accommodation space through the opening. The electrical connector includes a first base and a contacting ring. The first base of the electrical connector is disposed in the accommodation space. The contacting ring is located at an exterior of the accommodation space and adjacent to the extension part. The LED is disposed in the aperture of the extension part and includes a second base and a lens. The lens is disposed on the second base of the LED. The second base of the LED and the contacting ring of the electrical connector are located on different surfaces. The lens and portion of the second base of the LED are exposed from the opening. The other portion of the second base of the LED is covered by the contacting ring of the electrical connector.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
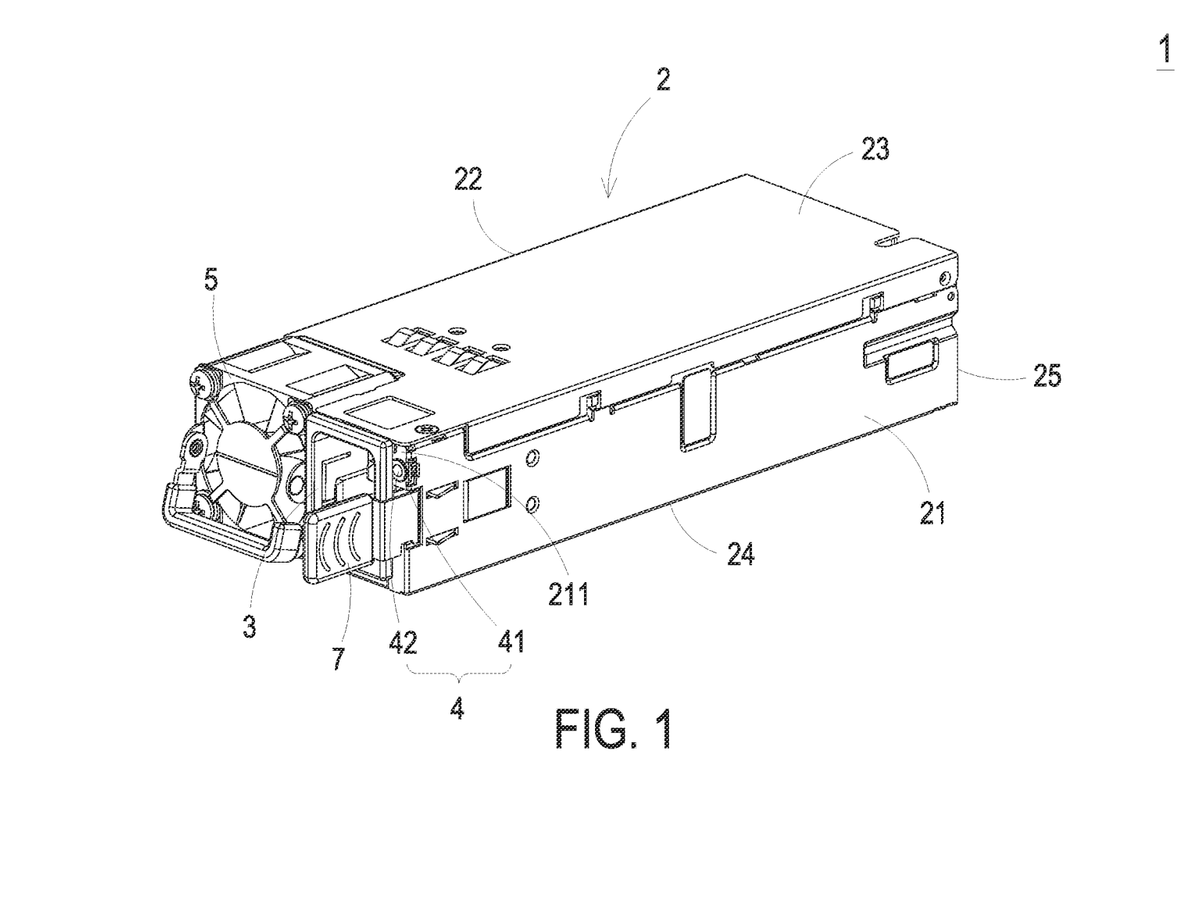
FIG. 1 is a schematic perspective view illustrating a power supply according to a first embodiment of the present disclosure.
Figure 2:
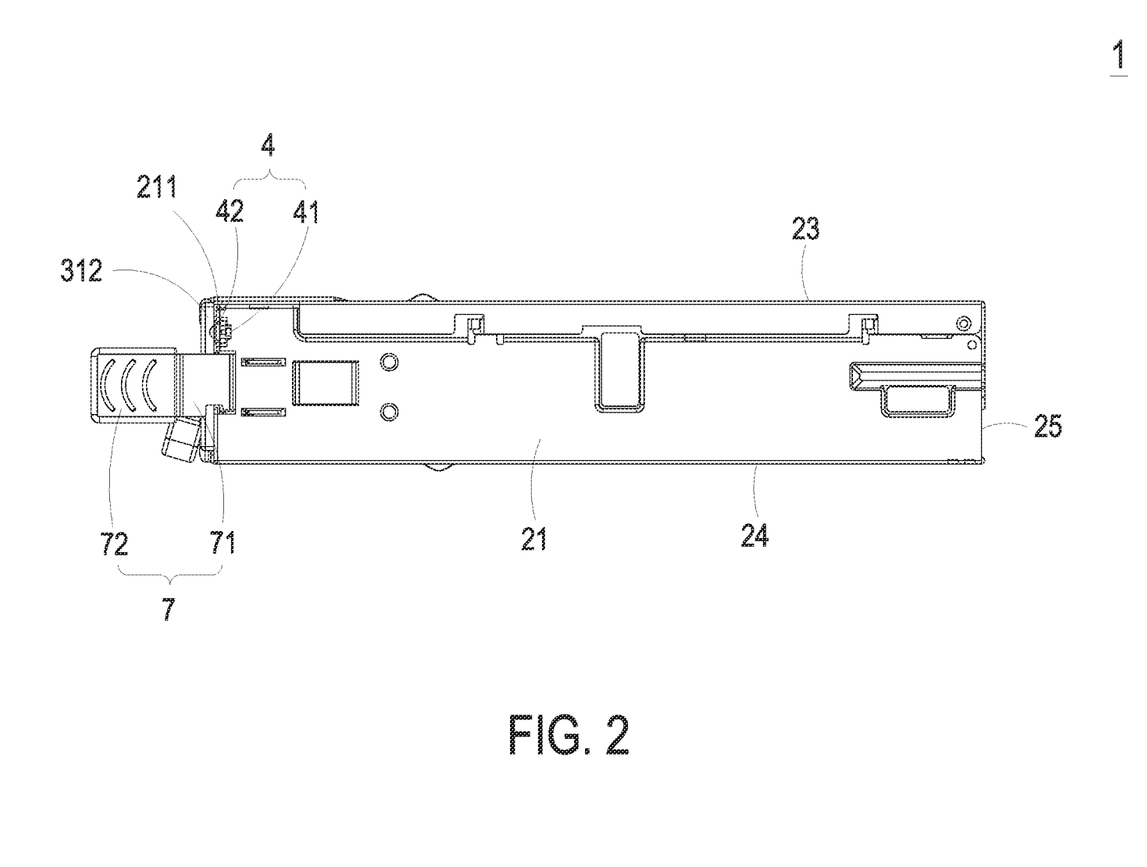
FIG. 2 is a side elevational view illustrating the power supply of FIG. 1.
Figure 3:
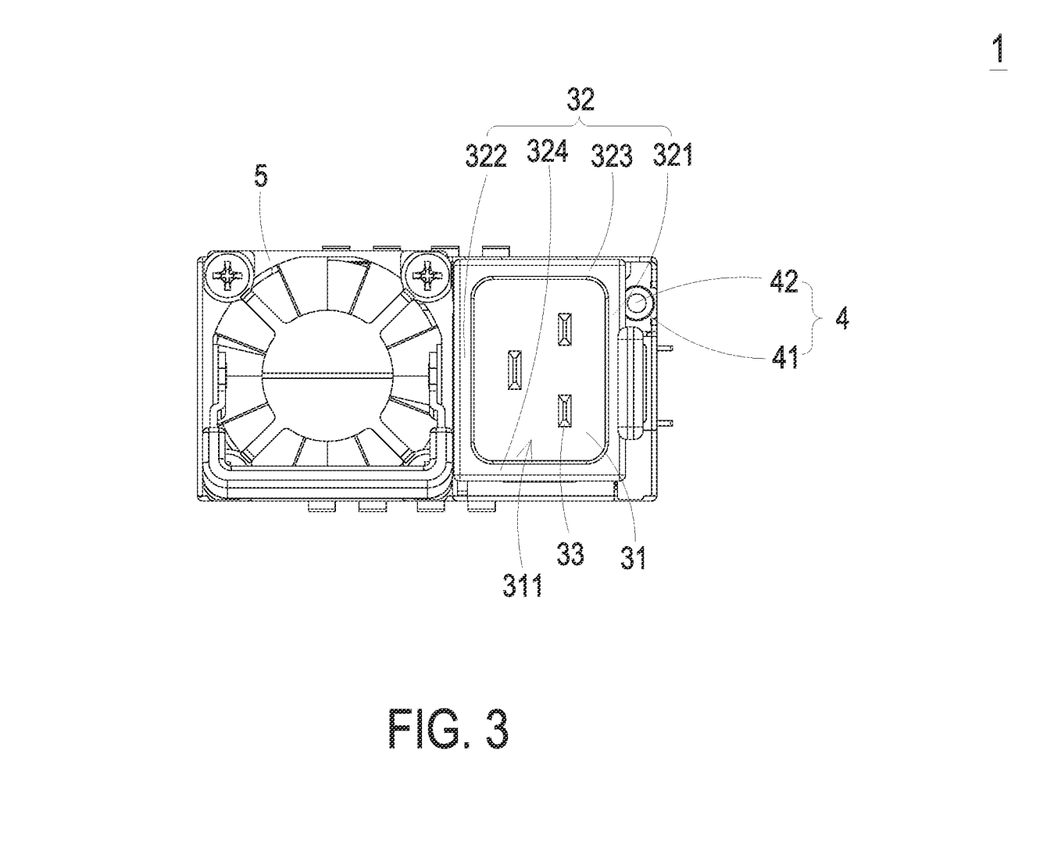
FIG. 3 is a front elevational view illustrating the power supply of FIG. 1.
Figure 4:
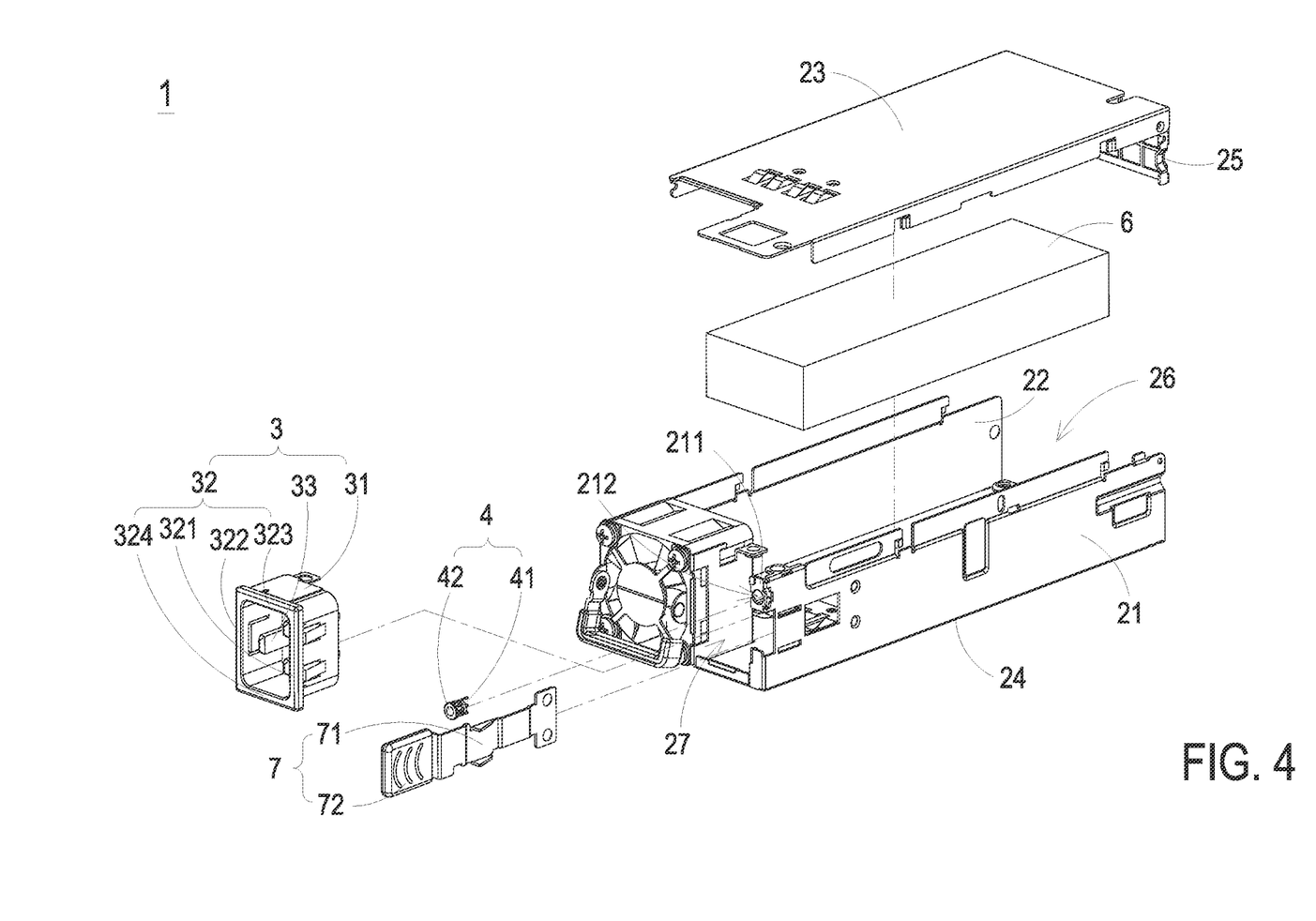
FIG. 4 is a schematic exploded perspective view illustrating the power supply of FIG. 1.

FIG. 1 is a schematic perspective view illustrating a power supply according to a first embodiment of the present disclosure. FIG. 2 is a side elevational view illustrating the power supply of FIG. 1. FIG. 3 is a front elevational view illustrating the power supply of FIG. 1. FIG. 4 is a schematic exploded view illustrating the power supply of FIG. 1. As shown in FIGS. 1 to 4, the power supply 1 of the present disclosure receives an electrical energy from an external power source (not shown in the figure) and supplies the electrical energy to a load. The power supply 1 includes a case 2, an electrical connector 3 and a light emitting diode 4 (hereinafter referring to as LED 4). Preferably but not exclusively, the electrical connector 3 is a socket.

The case 2 includes a first side wall 21, a second side wall 22, a third side wall 23, a fourth side wall 24 and a rear wall 25. The first side wall 21 and the second side wall 22 are opposite to each other. The third side wall 23 and the fourth side wall 24 are opposite to each other. The third side wall 23 and the fourth side wall 24 are located between the first side wall 21 and the second side wall 22. The two opposite lateral edges of the first side wall 21 are connected with the third side wall 23 and the fourth side wall 24, respectively. The two opposite lateral edges of the second side wall 22 are connected with the third side wall 23 and the fourth side wall 24, respectively. The first side wall 21, the second side wall 22, the third side wall 23 and the fourth side wall 24 are connected with the rear wall 25, respectively. The first side wall 21, the second side wall 22, the third side wall 23, the fourth side wall 24 and the rear wall 25 collaboratively define an accommodation space 26. The accommodation space 26 has an opening 27. The opening 27 of the accommodation space 26 and the rear wall 25 are located at two opposite sides of the case 2. The first side wall 21, the second side wall 22, the third side wall 23 and the fourth side wall 24 are located between the opening 27 of the accommodation space 26 and the rear wall 25. In this embodiment, the length of the first side wall 21 is 18.5 cm. The width of the first side wall 21 is 3.9 cm. The length of the rear wall 25 is 7.35 cm. The width of the rear wall 25 is 3.9 cm. It is noted that the lengths and the widths described above are not limited and can be adjusted according to the practical requirements.

The first side wall 21 includes an extension part 211. The extension part 211 is extended from the first side wall 21 toward the second side wall 22 and adjacent to the opening 27 of the accommodation 26. In the embodiment, the extension part 211 is located in the opening 27 of the accommodation 26. The extension part 211 has an aperture 212. In this embodiment, the aperture 212 is adjacent to the third side wall 23.

Portion of the electrical connector 3 is disposed in the accommodation space 26 through the opening 27. The electrical connector 3 includes a first base 31, a contacting ring 32 and at least one conductive terminal 33. The first base 31 of the electrical connector 3 is disposed in the accommodation space 26 of the case 2. The first base 31 of the electrical connector 3 includes a recess 311. The opening of the recess 311 faces a direction away from the rear wall 25. The contacting ring 32 of the electrical connector 3 is connected with the first base 31 and disposed around the outer periphery of the base 31 of the electrical connector 3. The contacting ring 32 is located at the exterior of the case 2 and is not located in the accommodation space 26 of the case 2. Portion of the contacting ring 32 is adjacent to the extension part 211 of the first side wall 21. Preferably, portion of the contacting ring 32 is adjacent to the aperture 212 of the extension part 211 of the first side wall 21. In this embodiment, the aperture 212 of the extension part 211 and the contacting ring 32 of the electrical connector 3 are located on different surfaces. The intersection between the contacting ring 32 and the first base 31 of the electrical connector 3 is adjacent to the extension part 211 of the first side wall 21. Consequently, portion of the extension part 211 of the first side wall 21 is covered by the contacting ring 32. Preferably, portion of the aperture 212 of the extension part 211 is covered by the contacting ring 32. The at least one conductive terminal 33 is disposed in the recess 311 of the first base 31 of the electrical connector 3. While the conductive terminal 33 of the electrical connector 3 is contacted with a conductive terminal of a mating electrical connector, the electrical energy from the external power source is received by the power supply 1 and supplied to a load through the connection between the electrical connector 3 and the mating electrical connector.

The LED 4 is served as an indication light of the power supply 1. The LED 4 is disposed on the extension part 211. Portion of the LED 4 is disposed in the aperture 212 of the extension part 211. In this embodiment, the LED substrate is omitted, and the LED 4 needn't to be mounted on the LED substrate. One terminal of the LED 4 is connected to a conductive wire (not shown in the figure) for receiving electrical energy. The LED 4 further includes a second base 41 and a lens 42. Portion of the second base 41 of the LED 4 is fitted in the aperture 212 of the extension part 211 and fixed to the aperture 212 of the extension part 211. The other portion of the second base 41 of the LED 4 is disposed in the accommodation space 26. The lens 42 is disposed on the second base 41 of the LED 4 and located at the exterior of the accommodation space 26 of the case 2. In this embodiment, the lens 42 is a hemisphere structure. Moreover, as shown in FIG. 3, the second base 41 of the LED 4 and the contacting ring 32 of the electrical connector 3 are located on different surfaces. Consequently, the lens 42 and portion of the second base 41 of the LED 4 are exposed from the opening 27. The other portion of the second base 41 of the LED 4 is covered by the contacting ring 32 of the electrical connector 3.

From above descriptions, the LED 4 of the power supply 1 of the present disclosure is directly disposed in the aperture 212 of the extension part 211 of the first side wall 21. The LED of the conventional power supply is disposed on the LED substrate, and the LED substrate is disposed in the case of the power supply. Compared with the conventional power supply, the power supply 1 of the present disclosure omits the LED substrate so that the power supply 1 saves the space of the LED substrate and the available space of the case 2 is increased accordingly. Alternatively, the case 2 with smaller volume is employed in the power supply 1 of the present disclosure. Moreover, portion of the second base 41 of the LED 4 of the power supply 1 is covered by the contacting ring 32 of the electrical connector 3. The entirety of the LED and the electrical connector of the conventional power supply are exposed from the exterior of the case. Compared with the conventional power supply, the area of the opening 27 of the case 2 is less than the area of the LED 4 plus the area of the electrical connector 3 due to the arrangements of the LED 4 and the electrical connector 3 of the power supply 1. Consequently, the available space of the case 2 of the power supply 1 is increased, or the case 2 with smaller volume is employed for the power supply 1.

Please refer to FIGS. 3 and 4 again. The contacting ring 32 of the electrical connector 3 includes a first contacting side 321, a second contacting side 322, a third contacting side 323 and a fourth contacting side 324. The first contacting side 321 and the second contacting side 322 are opposite to each other. A first surface of the first contacting side 321 faces to the exterior of the accommodation space 26. Portion of a second surface of the first contacting side 321 is contacted with a surface of the extension part 211 of the first side wall 21. Preferably, portion of the second surface of the first contacting side 321 is contacted with the aperture 212 of the extension part 211. Consequently, portion of the aperture 212 of the extension part 211 is covered by the first contacting side 321. In this embodiment, as shown in FIG. 2, the distance between the first surface of the first contacting side 321 and the surface of the extension part 211 is greater than the distance between a surface center of the lens 42 of the LED 4 and the surface of the extension part 211. That is, the first surface of the first contacting side 321 and the surface center of the lens 42 of the LED 4 are located on different surfaces. The third contacting side 323 and the fourth contacting side 324 are opposite to each other. The third contacting side 323 and the fourth contacting side 324 are located between the first contacting side 321 and the second contacting side 322. A first surface of the third contacting side 323 faces to the exterior of the accommodation space 26. A second surface of the third contacting side 323 is contacted with one lateral edge of the third side wall 23. A first surface of the fourth contacting side 324 faces to the exterior of the accommodation space 26. A second surface of the fourth contacting side 324 is contacted with one lateral edge of the fourth side wall 24.

In this embodiment, the power supply 1 further includes a fan 5 for dissipating the heat of the power supply 1. The fan 5 is disposed on any one of the side walls of the case 2. Preferably but not exclusively, as shown in FIG. 1, the fan 5 is disposed on the second side wall 22 and adjacent to the opening 27.

Figure 5:
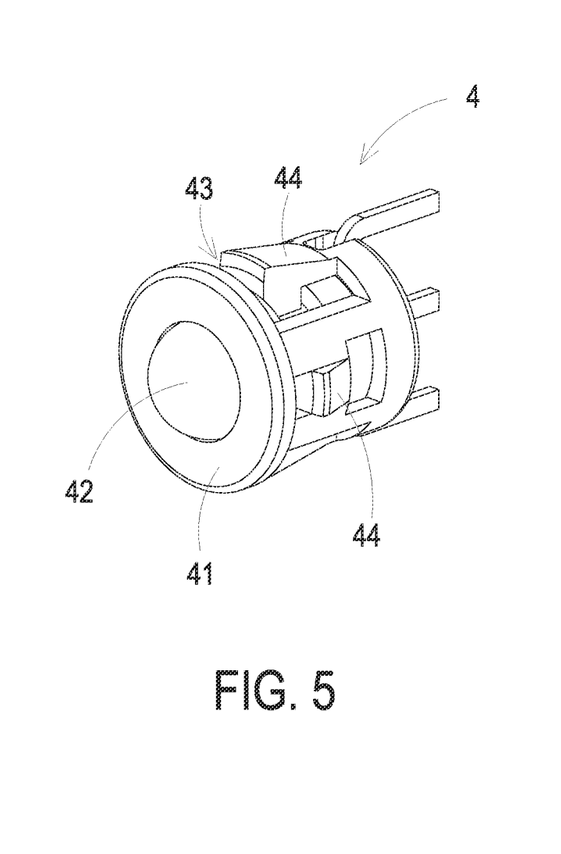
FIG. 5 is a schematic perspective view illustrating a LED of the power supply of FIG. 1.

FIG. 5 is a schematic perspective view illustrating the LED of the power supply of FIG. 1. As shown in FIGS. 1 to 5, the LED 4 includes a groove 43 and at least one engaging part 44. The groove 43 of the LED 4 is disposed around the outer periphery of the LED 4. The groove 43 is corresponding in position to the aperture 212 of the extension part 211. Consequently, the groove 43 of the LED 4 is engaged with the extension part 211 through the aperture 212 of the extension part 211. The engaging part 44 of the LED 4 is disposed on the outer periphery of the second base 41 of the LED 4. The engaging part 44 is adjacent to the groove 43 and located in the accommodation space 26. While the groove 43 of the LED 4 is engaged with the extension part 211 through the aperture 212, the engaging part 44 is engaged with the extension part 211.

Please refer to FIGS. 1 and 4 again. The power supply 1 further includes at least one electronic device 6 and a pressing part 7. The at least one electronic device 6 is disposed in the accommodation space 26 of the case 2. The at least one electronic device 6 is adjacent to the electrical connector 3 and contacted with the electrical connector 3. Portion of the pressing part 7 is disposed in the accommodation space 26 through the opening 27. The pressing part 7 includes a first portion 71 and a second portion 72. The first portion 71 and the second portion 72 are connected with each other. The first portion 71 of the pressing part 7 is disposed on the first side wall 21 and located in the accommodation space 26. One side of the first portion 71 is contacted with the electronic device 6 and the electrical connector 3. The second portion 72 of the pressing part 7 is located at the exterior of the accommodation space 26. While a force is applied on the second portion 72 along a direction away from the second side wall 22, the first portion 71 is oblique along a direction toward the second side wall 22. Consequently, the electronic device 6 contacted with the first portion 71 is pushed to move along a direction away from the rear wall 25. While the electronic device 6 is moved, the electronic device 6 pushes the electrical connector 3 to move along a direction away from the rear wall 25. Then, the electronic device 6 and the electrical connector 3 are withdrawn from the accommodation space 26 through the opening 27. In this embodiment, the aperture 212 of the extension part 211 is located between the third side wall 23 and the pressing part 7.

Figure 6:
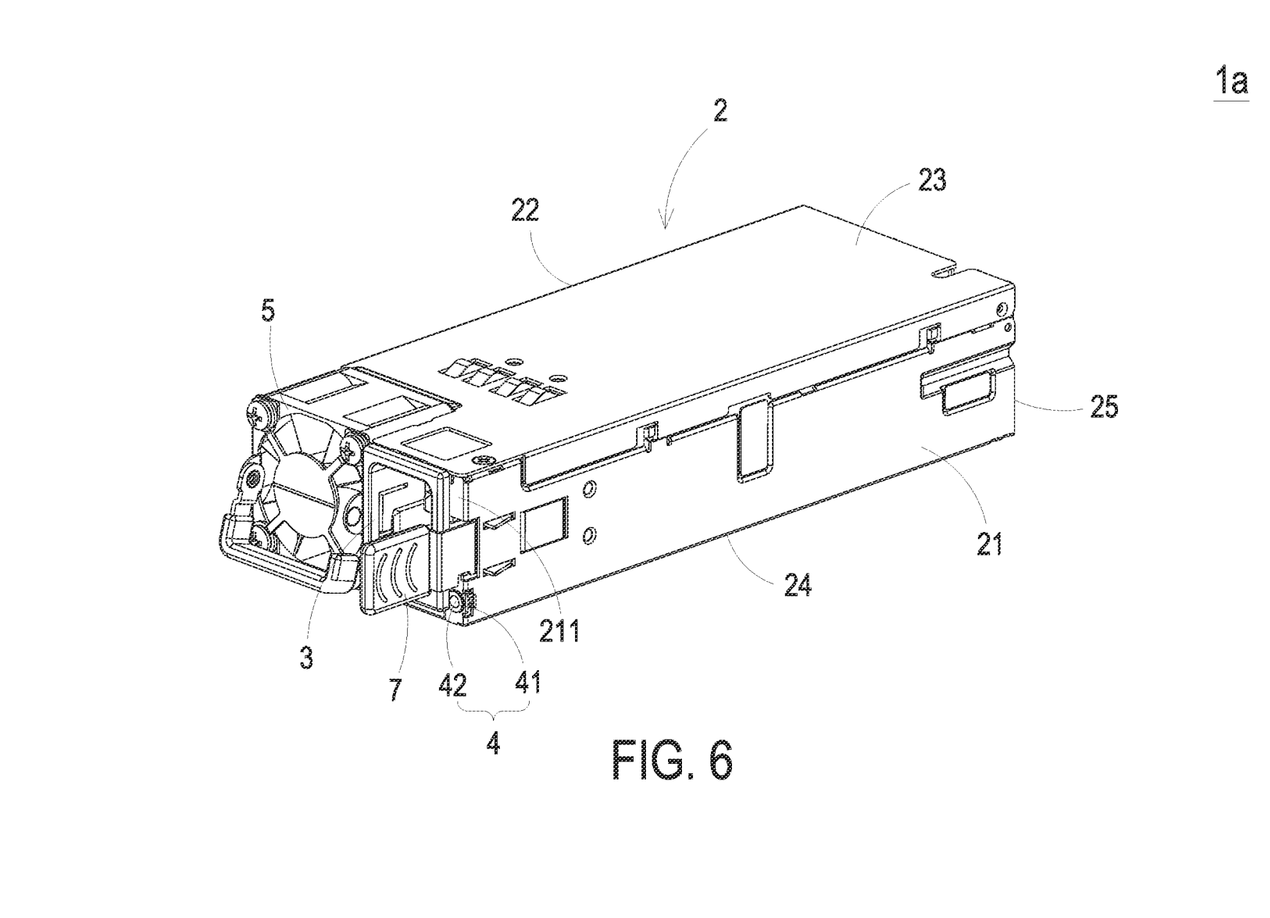
FIG. 6 is a schematic perspective view illustrating a power supply according to a second embodiment of the present disclosure.

In other embodiments, the position of the aperture 212 of the extension part 211 is varied according to the practical requirements. FIG. 6 is a schematic perspective view illustrating a power supply according to a second embodiment of the present disclosure. As shown in FIG. 6, the aperture 212 of the extension part 211 is adjacent to the fourth side wall 24. The aperture 212 of the extension part 211 is located between the fourth side wall 24 and the pressing part 7.

From the above descriptions, the present disclosure provides a power supply. The LED of the power supply of the present disclosure is directly disposed in the aperture of the extension part of the first side wall. The power supply of the present disclosure omits the LED substrate so that the power supply saves the space of the LED substrate and the available space of the case is increased accordingly. Alternatively, the case with smaller volume is employed in the power supply of the present disclosure. Moreover, portion of the second base of the LED of the power supply is covered by the contacting ring of the electrical connector. Compared with the conventional power supply, the area of the opening of the case is less than the area of the LED plus the area of the electrical connector due to the arrangements of the LED and the electrical connector of the power supply. Consequently, the available space of the case of the power supply is increased, or the case with smaller volume is employed for the power supply.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply, comprising:
   a case comprising a first side wall, a second side wall, a third side wall, a fourth side wall and a rear wall, wherein the first side wall and the second side wall are opposite to each other, the third side wall and the fourth side wall are opposite to each other and located between the first side wall and the second side wall, wherein the first side wall, the second side wall, the third side wall, the fourth side wall and the rear wall collaboratively define an accommodation space having an opening, wherein the first side wall comprises an extension part, the extension part is extended from the first side wall toward the second side wall and is adjacent to the opening, and the extension part has an aperture;
   an electrical connector, wherein a portion of the electrical connector is disposed in the accommodation space through the opening, the electrical connector comprises a first base and a contacting ring, the first base of the electrical connector is disposed in the accommodation space, and the contacting ring is located at the exterior of the accommodation space and adjacent to the extension part; and
   a light emitting diode disposed in the aperture of the extension part and comprising a second base and a lens, wherein the lens is disposed on the second base of the light emitting diode, the second base of the light emitting diode and the contacting ring of the electrical connector are located on different surfaces, the lens and portion of the second base of the light emitting diode are exposed from the opening, and the other portion of the second base of the light emitting diode is covered by the contacting ring of the electrical connector.

2. The power supply according to claim 1, wherein two opposite lateral edges of the first side wall are connected with the third side wall and the fourth side wall, respectively, and two opposite lateral edges of the second side wall are connected with the third side wall and the fourth side wall, respectively, wherein the first side wall, the second side wall, the third side wall and the fourth side wall are connected with the rear wall, respectively.

3. The power supply according to claim 2, wherein the contacting ring comprises a first contacting side, a second contacting side, a third contacting side and a fourth contacting side, wherein the first contacting side and the second contacting side are opposite to each other, a first surface of the first contacting side faces to the exterior of the accommodation space, a second surface of the first contacting side is contacted with a surface of the extension part, the third contacting side and the fourth contacting side are opposite to each other, the third contacting side and the fourth contacting side are located between the first contacting side and the second contacting side, a first surface of the third contacting side faces to the exterior of the accommodation space, a second surface of the third contacting side is contacted with one lateral edge of the third side wall, a first surface of the fourth contacting side faces to the exterior of the accommodation space, and a second surface of the fourth contacting side is contacted with one lateral edge of the fourth side wall.

4. The power supply according to claim 3, wherein a distance between the first surface of the first contacting side and the surface of the extension part is greater than a distance between a surface center of the lens of the light emitting diode and the surface of the extension part.

5. The power supply according to claim 2, wherein the power supply comprises at least one electronic device and a pressing part, the at least one electronic device is disposed in the accommodation space, a portion of the pressing part is disposed in the accommodation space through the opening, the pressing part comprises a first portion and a second portion, the first portion and the second portion are connected with each other, the first portion is located in the accommodation space and contacted with the at least one electronic device and the electrical connector, and the second portion is located at the exterior of the accommodation space, wherein while a force is applied on the second portion, the first portion is oblique along a direction toward the second side wall, the at least one electronic device and the electrical connector are moved along a direction away from the rear wall, and the electronic device and the electrical connector are withdrawn from the accommodation space through the opening.

6. The power supply according to claim 5, wherein the aperture of the extension part is located between the third side wall and the pressing part.

7. The power supply according to claim 5, wherein the aperture of the extension part is located between the fourth side wall and the pressing part.

8. The power supply according to claim 1, wherein the power supply comprises a fan for dissipating the heat of the power supply, and the fan is disposed on the case and adjacent to the opening.

9. The power supply according to claim 1, wherein the light emitting diode comprises a groove and at least one engaging part, the groove is disposed around an outer periphery of the light emitting diode, the groove is engaged with the extension part through the aperture, the at least one engaging part is disposed on an outer periphery of the second base of the light emitting diode, the at least one engaging part is adjacent to the groove and located in the accommodation space, and the at least one engaging part is engaged with the extension part through the aperture.

* * * * *